United States Patent [19]
Okamura et al.

[11] Patent Number: 6,016,188
[45] Date of Patent: Jan. 18, 2000

[54] MACHINE FOR MAKING PRINTING PLATES FOR NEWSPAPER PRINTING

[75] Inventors: Yuichi Okamura, Osaka-fu; Junichi Hosokawa, Chiba-ken; Takemi Watanabe, Osaka-fu, all of Japan

[73] Assignee: Kabushiki Kaisha Kaneda Kikai Seisakusho, Osaka-fu, Japan

[21] Appl. No.: 09/241,097

[22] Filed: Feb. 1, 1999

Related U.S. Application Data

[62] Division of application No. 08/914,208, Aug. 19, 1997, Pat. No. 5,887,525.

[51] Int. Cl.⁷ .............................. G03B 27/04; G03B 27/22
[52] U.S. Cl. ........................ 355/89; 355/104; 101/463.1; 101/401.1
[58] Field of Search .................................... 355/23, 24, 26, 355/88, 89, 100, 102, 104, 106, 107, 110, 27; 101/463.1, 401.1

[56] References Cited

U.S. PATENT DOCUMENTS

| | | | |
|---|---|---|---|
| 3,981,583 | 9/1976 | Tsuchida et al. | 355/85 |
| 4,571,073 | 2/1986 | Diedrich et al. | 355/99 |
| 5,606,172 | 2/1997 | Morita et al. | 355/85 |

FOREIGN PATENT DOCUMENTS 0 762 723 A2   3/1997   European Pat. Off. .

*Primary Examiner*—D. Rutledge
*Attorney, Agent, or Firm*—Griffin, Butler, Whisenhunt & Szipl, LLP

[57] ABSTRACT

A photoengraving machine of this invention increases photoengraving speed without unduly increasing size or manufacturing costs of a CPT-type photoengraving machine by decreasing waiting time for form plates transferred from a plate feed section. The machine comprises a plate feed section, an exposure section, a plate discharge section, and a development section to make a drawing on a form plate at the exposure section in accordance with a signal output from a computer. The form-plate feed section has a stocker case for storing form plates and a transfer unit set above the stocker case to be vertically movable for transferring form plates along a guide rail. The exposure section has at least two exposure barrels arranged at intervals, a laser-beam scanning head, a first table on a side of each exposure barrel toward the form-plate feed section, and a second table on a development-section side of each exposure barrels. The plate discharge section has a discharge table on an exposure-section side of the development section.

2 Claims, 9 Drawing Sheets

MACHINE FOR MAKING PRINTING PLATES FOR NEWSPAPER PRINTING

This is a divisional application of Ser. No. 08/914,208, filed Aug. 19, 1997, now U.S. Pat. No. 5,887,525.

BACKGROUND OF THE INVENTION

1. Field Of The Invention

The present invention relates to improvements of so-called CTP (Computer to Plate) machines for directly forming desired drawings on form plates by operating laser-beam scanning heads with drawing image signals sent from computers; which CTP machines are used to make printing plates for newspaper printing and the like.

2. Prior Art

Because use of computers in the information processing art, or image processing art, has increased in recent years, a printing plate making machine for a CTP-system for making printing plates for newspaper printing has been developed and put to practical use. This printing-plate-making machine forms a drawing directly on a plate with a laser beam in accordance with drawing image signals sent from a computer.

For news printing however, it is very important to improve printing efficiency because it is often required that great numbers of newspapers be printed in short times. In order to print a great number of newspapers in a short time, in accordance with such requirements, it is necessary to further decrease a time of "stop of operation" of a rotary press for carrying out so-called printing plate replacement. For example, it is necessary to decrease a number of printing plates to be replaced by increasing the size of the printing plates. Thus, the time required for printing-plate setting can be decreased by decreasing the number of printing plates to be replaced.

However, if the size of the plates is increased, for example the plate equivalent of one page of newspaper (lateral width W×length L) could be changed to be a plate equivalent of two pages of newspaper (lateral width W×length 2L), the required time for producing one printing plate is increased from approximately 4 minutes (in the case of one page) to approximately 5 minutes 30 seconds (in the case of two pages) because the drawing area of the plate increases.

As a result, even if the printing plate setting time required for printing-plate replacement can be approximately halved by increasing the size of printing plates (e.g. double size), supplying the printing plates is restricted due to speed restrictions in producing the printing plates and therefore, the problem occurs that equipment for producing the printing plates must be greatly enlarged.

To solve the above problems, the present applicant previously developed the machine shown in FIGS. 9–11 and a method disclosed in Japanese Patent Application No. 222141/1995 for producing printing plates for newspaper printing.

FIG. 9 is an exterior view of a machine for producing printing plates for newspaper printing in which a dark-room section F, a plate feed section A, an exposure section B, a plate discharge section C, a development section D, and a printing plate storage section E are basically provided along a longitudinal direction of a machine body K. Moreover, though not illustrated, laser-beam scanning heads are operated with so-called image signals sent to the exposure section B from a computer provided at a separate control section and laser scanning corresponding to the image signals is applied to OPC layers of OPC (organic Photo Conductor) plates, and thereby image-signal drawings are drawn on plate surfaces as electrostatic latent images.

FIGS. 10 and 11 are respective top and side views showing outlines of the arrangement of the plate feed section A, the exposure section B, and the plate discharge section C of the machine of FIG. 9 for producing printing plates for newspaper printing.

The plate feed section A comprises a stocker case 1, a vacuum-type sucker 2, a transfer unit 3, and a guide rail 4. OPC plates P, each provided with an organic photo conductor layer and being stored in the stocker case 1, are transferred to the exposure section B by the transfer unit 3 one by one.

A plurality of plates P are superposed on one another, being packed with slip sheets for protecting surfaces of the form plates between them. The packed plates P are unpacked in the dark-room section F and the slip sheets are removed from between them and thereafter, only the plates P are superposed in the stocker case 1. The stocker case 1, in which the form plates P are superposed, is at a predetermined position in the plate feed section A relative to the dark-room section F.

The exposure section B (there are actually two sub-exposure sections B1 and B2), comprises a table 5 (5a and 5b), an exposure barrel 6 (6a and 6b), a roller 7 (7a and 7b), and a laser-beam scanning head 8 (8a and 8b). In the case of this machine H for producing the printing plates for newspaper printing, the two sub-exposure sections B1 and B2 are provided to expedite production of the printing plates, the two sub-exposure sections being spaced an interval along the longitudinal direction of the machine body K from one another, the exposure barrel of each being rotatable about its laterally positioned axis.

Moreover, two laser-beam scanning heads 8 (8a1, 8a2 and 8b1, 8b2) are arranged at each sub-exposure section B1 and B2. By synchronously operating these two laser-beam scanning heads, a drawing is formed on the plates P at a speed two times higher than when only one laser-beam scanning head 8 is used.

The plate discharge section C comprises a discharge table 9 provided between the exposure section B and the development section D. Exposed plates P transferred from each sub-exposure section B1, B2 by the transfer unit 3 are discharged onto the plate discharge section C and subsequently sent to the development section D.

In FIG. 11, a plate P transferred onto the table 5a via a route $R_1$ by the transfer unit 3 is wound about the first exposure barrel 6a by a counterclockwise rotation of the roller 7a and a clockwise rotation of the first exposure barrel 6a and then, the laser-beam scanning head 8a is operated, thereby making a drawing corresponding to a drawing image signal output from the computer section (not shown).

When predetermined laser-beam scanning is completed, the roller 7a and the first exposure barrel 6a are respectively rotated in opposite directions, and the exposed plate P is discharged temporarily onto the table 5a. Then, the exposed plate P is transferred onto the discharge table 9 by the transfer unit 3 via a route $R_2$ and the transfer unit 3, having released the plate P, is returned to the stocker case 1 via a route $R_3$.

same operation is also performed at the second exposure barrel 6b, with a new plate P being transferred onto the table 5b via a route $R_4$ while a drawing on the plate P is being made at the first exposure barrel 6a. When a drawing at the second exposure barrel 6b is completed, the exposed form plate P is transferred onto the discharge table 9 from the table 5b via a route R₅. Operations of the first exposure barrel 6a, the second exposure barrel 6b and the transfer unit 3 are sequentially performed in accordance with a predetermined timing program and the exposed plates P are thus alternately sent into the development section D from the exposure barrels 6a and 6b.

Problems To Be Solved By The Invention

The machine for making the printing plates for newspaper printing shown in FIGS. 9–11 requires the following time to process a plate P for one page of newspaper with one operating laser-beam scanning head.

| | |
|---|---|
| Time for drawing by rotation of exposure barrel | Approximately 153 sec. |
| Time for placing the plate on the exposure barrel | Approximately 13 sec. |
| Time for removing the plate from exposure barrel | Approximately 13 sec. |
| Time for transferring the plate (Route R₁) | Approximately 15 sec. |
| Time for transferring the exposed plate (Route R₂) | Approximately 15 sec. |
| Time for allowing transfer unit to return (Route R₃) | Approximately 15 sec. |

That is, because the tables 5a and 5b are used to hold the plates P before their engagement with the exposure barrels 6a and 6b and also to hold the plates P after their removal from the exposure barrels 6a and 6b, it is impossible to transfer new plates P to the exposure barrels 6a and 6b until the old plates P, which have been removed from the exposure barrels 6a and 6b have been transferred from the tables 5a and 5b to the discharge table 9. As a result, an amount (approximately 45 seconds) of the total operation time of the transfer unit 3 in the preceding exposure operation for one exposure barrel 6 is so-called waiting time in which operation of the exposure barrel 6 is suspended. Even if drawing time is shortened by using a plurality of laser-beam scanning heads 8, there remains the problem that it is impossible to greatly shorten the overall time for making printing plates because the time for waiting for new (or next) plates P is relatively long and it is impossible to quickly feed the next plates P.

It is an object of the present invention to solve the above problem of the machine shown in FIGS. 9 to 11 for making printing plates for newspaper printing and to provide a machine for making printing plates for newspaper printing which, without an increase in size and manufacturing costs of the machine, can greatly increase the speed of making the printing plates.

SUMMARY

According to principles of this invention, a first embodiment of a machine for making printing plates for newspaper printing of this invention has a plate feed section A (reference to FIG. 1), an exposure section B, a plate discharge section C and a development section D arranged in a longitudinal direction of a machine body K to directly form a drawing corresponding to a drawing image signal output from a computer on a surface of a plate P. The plate feed section A includes a stocker case 1 for storing a plurality of plates P and a transfer unit 3 positioned above the stocker case 1 and movable up and down to transfer respective plates P held by a sucker 2 along a guide rail 4 in the longitudinal direction of the machine body K. The exposure section B, or subexposure sections B1 and B2, comprises at least two exposure barrels 6a and 6b which are arranged at intervals in the longitudinal direction of the machine body K and on which plates P are respectively wound, at least one laser-beam scanning head 8 for forming drawings on the plates P wound on the exposure barrels 6a and 6b, first tables 10a and 10b positioned on respective upstream sides (in a direction of the plate feed section A) of the exposure barrels 6a and 6b to hold the plates P and push them to the exposure barrels 6a and 6b, and second tables 11a and 11b on downstream sides (in the direction of the development section D) of the exposure barrels 6a and 6b to hold exposed plates P. Moreover a plate discharge section C comprises a discharge table 9 at the upstream side of the development section D (in the direction of exposure section B) to hold the exposed plates P and transfer them to the development section D. In operation, the plates P are transferred from the stocker case 1 to the first tables 10a and 10b and exposed plates P are transferred from the second tables 11a and 11b to the discharge table 9 by the single transfer unit 3.

In a second embodiment, such a machine has a plate feed section A, an exposure section B, a plate discharge section C, and a development section D serially arranged along a machine body K to directly form drawings corresponding to drawing image signals output from a computer on surfaces of plates P. The plate feed section A includes a stocker case 1 for storing a plurality of plates P, and a transfer unit 3 positioned above the stocker case 1 and movable up and down to transfer respective plates P held by a sucker 2 along a guide rail 4 in a longitudinal direction of the machine body K. The exposure section B comprises: at least two exposure barrels 6a and 6b on which the plates P are respectively wound positioned adjacent the plate feed section A, the exposure barrels being arranged at intervals along the longitudinal direction of the machine body K and being oriented with their axes in the longitudinal direction; at least one laser-beam scanning head 8 for forming drawings on the form plates P wound on the exposure barrels 6a and 6b; and first tables 10a and 10b positioned on sides (in a direction of the plate feed section A) of the exposure barrels to hold the plates P and push them to the exposure barrels 6a and 6b. The plate discharge section C comprises a conveyor system 14 provided laterally adjacent the exposure barrels 6a and 6b, separate from the plate feed section A, to transfer exposed plates P received from the exposure barrels 6a and 6b in the longitudinal direction of the machine body K. In operation, the plates P are transferred from the stocker case 1 to the first tables 10a and 10b by the single transfer unit 3 and exposed plates P are transferred from the exposure barrels 6a and 6b to the development section D by the conveyor system 14.

A third embodiment relates to a machine with a plate feed section A, an exposure section B, a plate discharge section C, and a development section D arranged along a longitudinal direction of a machine body K to directly form a drawing corresponding to a drawing image signal output from a computer on surfaces of plates P. The plate feed section A comprises a stocker case 1 for storing a plurality of form plates P and a transfer unit 3 above the stocker case being movable up and down to transfer form plates P held by a sucker 2 along a guide rail 4 in the longitudinal direction of the machine body K. The exposure section B comprises at least two exposure barrels 6a and 6b adjacent the plate feed section A, arranged at intervals along the longitudinal direction of the machine body K in the longitudinal direction, on which the form plates P are respectively wound, a laser-beam scanning head 8 (8a and b) for forming drawings on the form plates P wound on the exposure barrels 6a and 6b, and first tables 10a and 10b provided on sides (toward the plate feed section A) of the exposure barrels 6*a* and 6*b* to hold the plates P and push them to the exposure barrels 6*a* and 6*b*. The plate discharge section C comprises a conveyer system 14 provided under the form-plate feed section A to transfer exposed plates P from the exposure barrels 6*a* and 6*b*, in the longitudinal direction of the machine body K. Thus new plates P are transferred from the stocker case 1 to the first tables 10*a* and 10*b* by the single transfer unit 3 and exposed plates P are transferred from the exposure barrels 6*a* and 6*b* to the development section D by the conveyer system 14.

Yet a fourth embodiment of the invention relates to a machine system having at least two machines Ha for making printing plates for newspaper printing, with each machining Ha having a plate feed section A, an exposure section B, a plate discharge section C, and a development section D arranged in the longitudinal direction of a machine body K to directly form drawings corresponding to a drawing image signal output from a computer on surfaces of form plates P. Each of the plate feed sections A comprises a stocker case 1 for storing a plurality of form plates P and a transfer unit 3 above the stocker case 1, being movable up and down to transfer form plates P held by a sucker 2 along a guide rail 4 in the longitudinal direction of the machine body K. Each exposure section B comprises an exposure barrel 6 on which form plates P are wound, a laser-beam scanning head 8 for forming a drawing on form plates P wound on the exposure barrel 6, and a first table 10 on the side of the exposure barrel 6 toward the plate feed section A to hold the plate P and push it to the exposure barrel 6. Each plate discharge section C comprises a discharge table 9 on the side of the development section D towards the exposure section B. The tables 9 respectively hold exposed plates P and push them to the development sections D. Thus, the plates P are transferred from the stocker cases 1 to the first tables 10 by the transfer units 3 and the exposed plates P are transferred from the exposure barrels 6 to the development sections D by the tables 9.

BRIEF DESCRIPTION OF THE DRAWINGS

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DETAILED DESCRIPTION OF PREFERRED EMBODIMENTS

Figure 1:
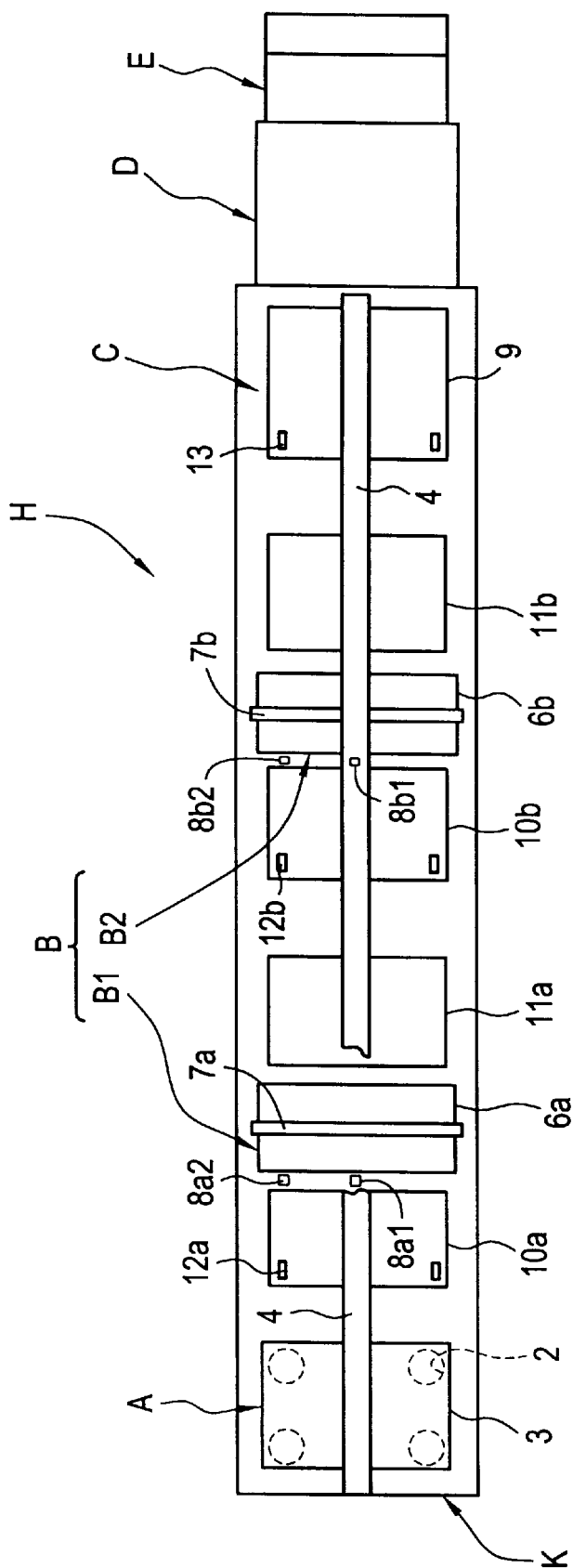
FIG. 1 is a schematic top view of a news-printing photoengraving machine of a first embodiment of the present invention.
Figure 2:
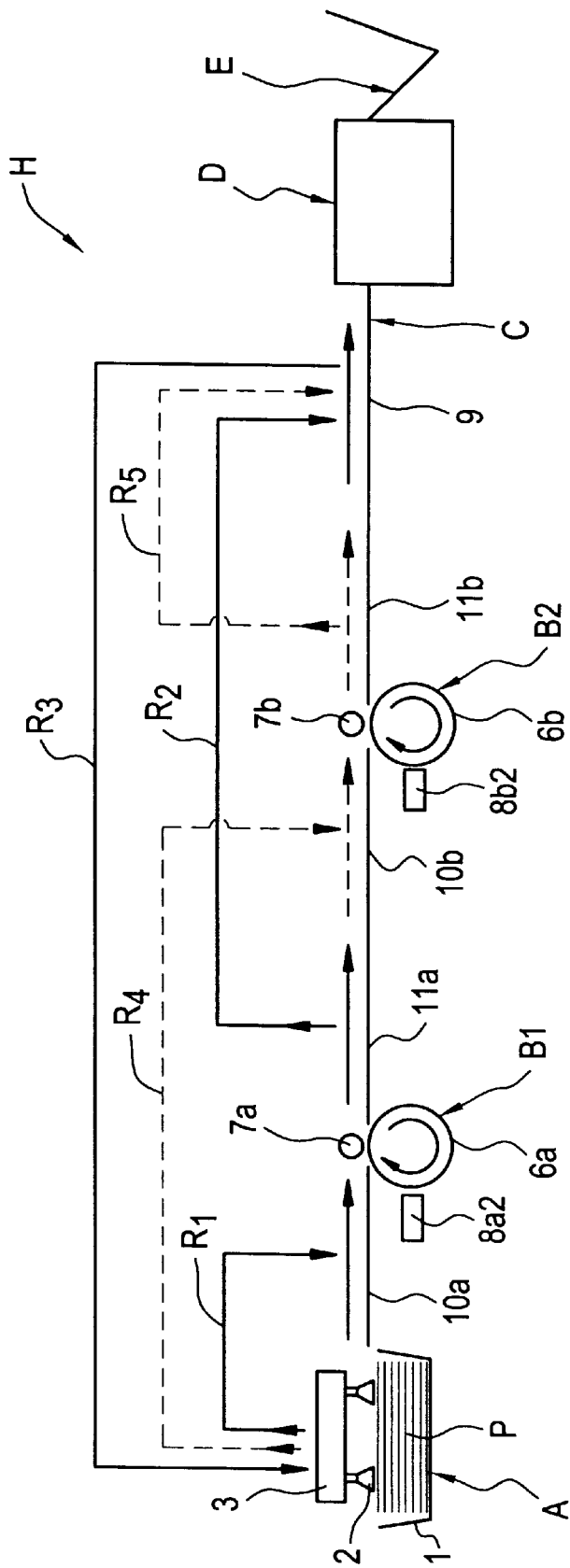
FIG. 2 is a schematic side view of the machine of FIG. 1.
Figure 9:
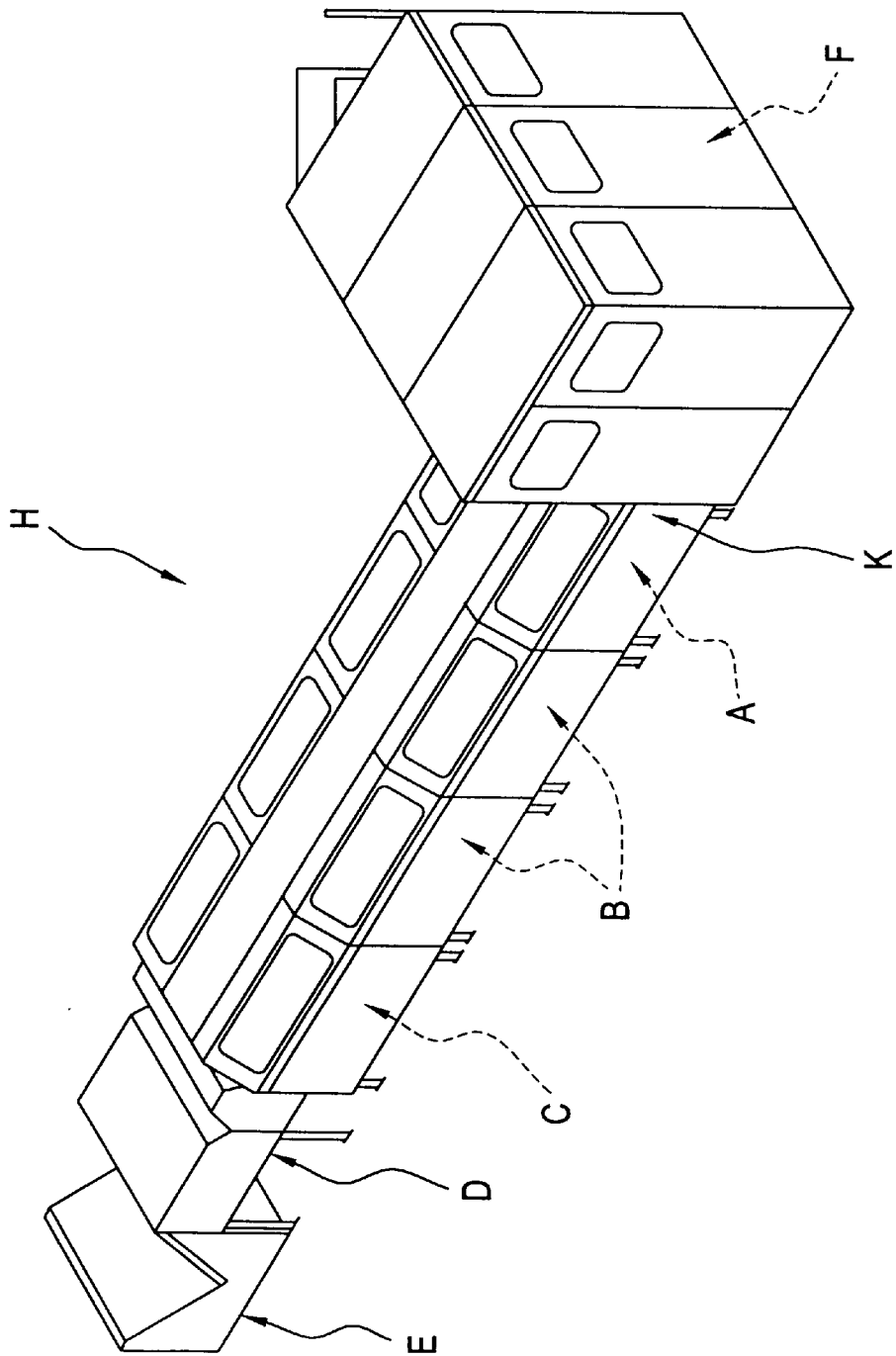
FIG. 9 is a perspective view of a previously-developed news-printing photoengraving machine.
Figure 10:
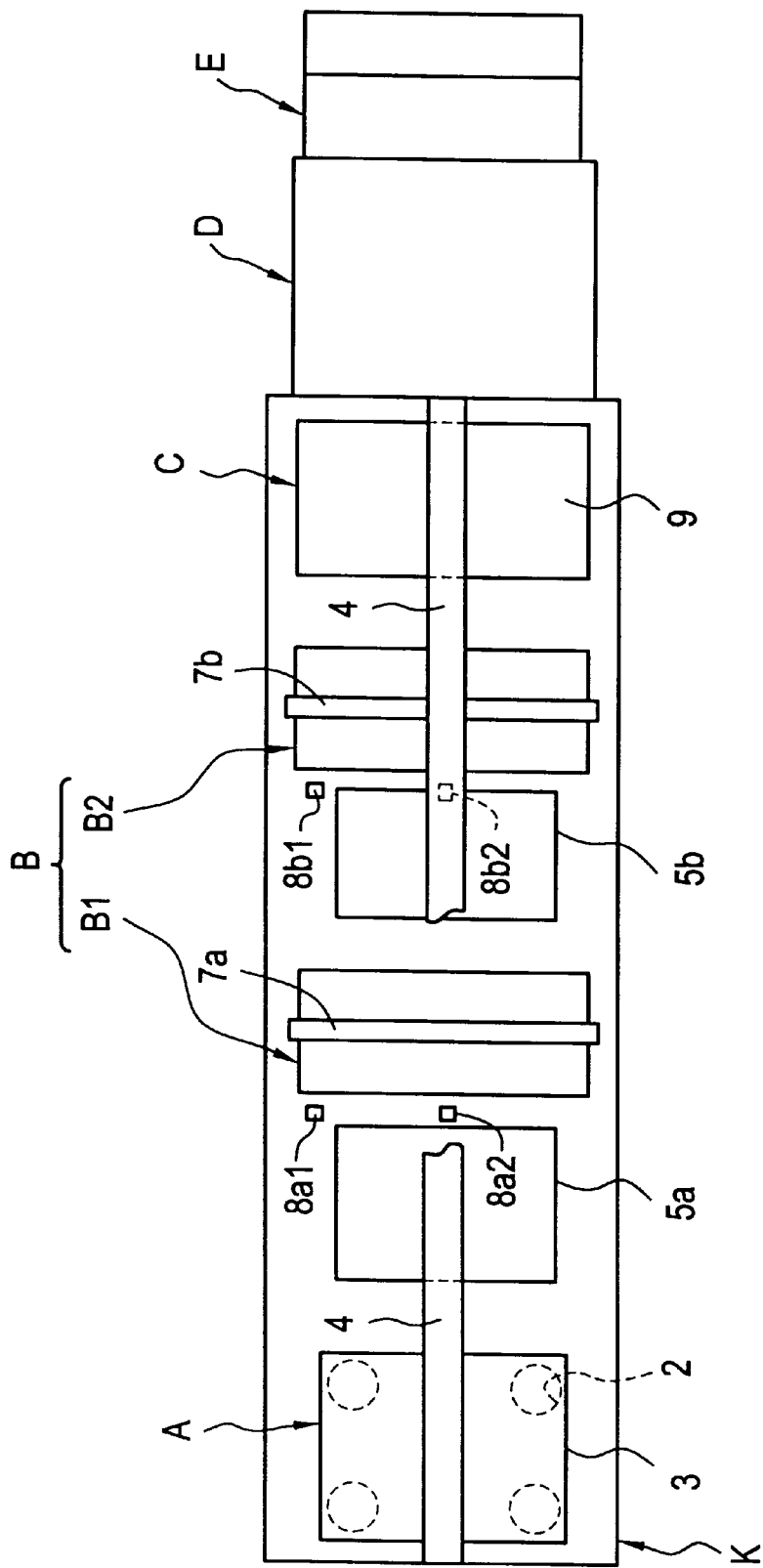
FIG. 10 is a top view showing an outline of the arrangement of a form-plate feed section, an exposure section, and a form-plate ejection section of the machine of FIG. 9.
Figure 11:
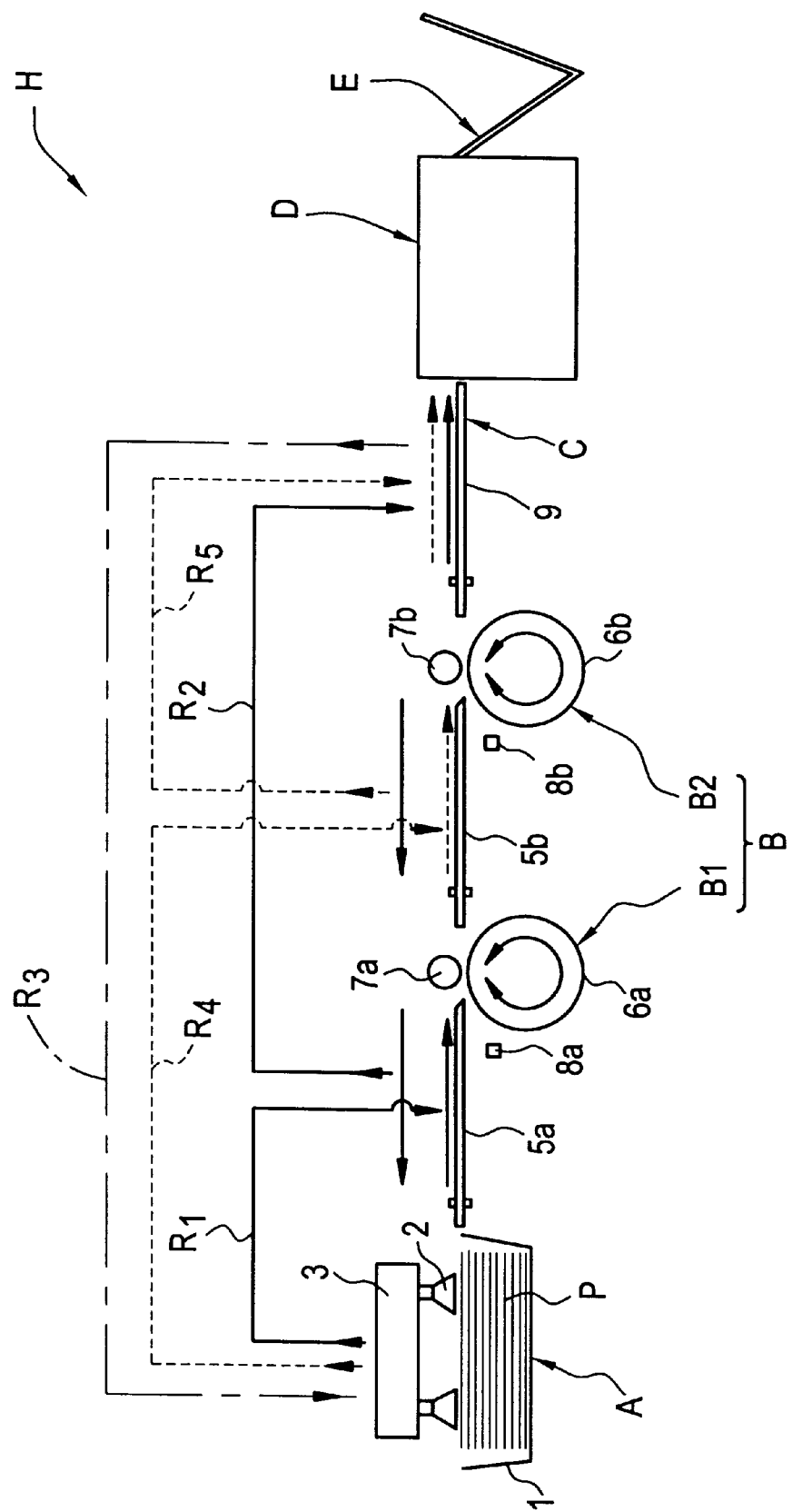
FIG. 11 is a schematic side view of the sections of FIG. 10.

FIGS. 1 and 2 are respectively schematic top and side views of a machine for making printing plates for newspaper printing of a first embodiment of the present invention. In FIGS. 1 and 2, as well as in figures depicting other embodiments, numbers and portions similar to those of the conventional machine shown in FIGS. 9 to 11 are accorded the same reference numerals as those of the conventional machine.

The machine H for making printing plates for newspaper printing includes a plate feed section A, an exposure section B, and a plate discharge section C, all of which are arranged in a machine body K; and a development section D and a plate storage section E which are arranged at a rear side of the plate discharge section C. Though not illustrated, a dark-room section is provided at a front of the plate feed section A, and a control section is also separately provided. The dark-room section, plate feed section A, exposure section B, plate discharge section C, development section D, and machine-plate storage section E are arranged along a longitudinal direction of the machine body K.

The plate feed section A, comprising a stocker case 1, feeds individual plates P, each with a predetermined shape and size (equivalent to one page or several pages of newspaper), to the exposure section B. The plate feed section A includes a vacuum-type sucker 2, a transfer unit 3, and a guide rail 4.

A plurality of plates P are superposed and packed with slip sheets therebetween for protecting surfaces of the plates. The packed plates P are unpacked in the dark-room section and slip sheets are removed from the plates. Thereafter, only the plates P are superposed on one another in the stocker case 1. The stocker case, in which the plates P are superposed, is inserted into a predetermined position of the plate feed section A from the dark-room section.

Although this embodiment uses as plates P, a type of plate with an organic photo conductor layer, it is also possible to use as the plates P, types of plates made of high-sensitivity photopolymer plate, silver plate, silver+diazo-hybrid plate, or thermo sensitive plate.

The exposure section B (which actually has two sub-exposure sections B1, B2) comprises first tables 10*a*, 10*b* exposure barrels 6*a*, 6*b*, rollers 7*a*, 7*b*, laser beam scanning heads 8*a*, 8*b* (each of which is divided into dual scanning heads 8*a*1, 8*a*2 and 8*b*1, 8*b*2) and second tables 11*a*, 11*b*, with the exposure barrels 6*a*, 6*b* being rotatable about lateral axes (axes in a direction perpendicular to the longitudinal direction of the machine body K) and being arranged at intervals along the longitudinal direction. For simplicity sake, the exposure barrels 6*a* and 6*b*, with associated first and second tables, and the multiple laser-beam scanning heads, as well as other multiple units will be identified with reference numerals which do not include the letter qualifiers; thus, for example, the laser-beam scanning heads 8*a*1, 8*b*1, etc. are sometimes referred to simply as the laser-beam scanning head 8, thereby indicating that there can be one or more such laser-beam scanning heads.

Though not illustrated, each exposure barrel 6 is provided with a pin, or pins, for positioning plates P by contacting respective leading edges of the plates 2, and vacuum suckers for holding the respective leading edges, as well as trailing edges, of the form plates P to the exposure barrel 6. A part of the roller 7 is decreased in diameter so that the roller 7 does not interfere with the pin of the exposure barrel 6. The first table 10 is provided with one or more extrusion pins 12 for temporarily holding the form plate P and pushing the held plate P to the exposure barrel B.

Although this embodiment employs a scanning method using the laser-beam scanning head 8 as a so-called external-drum scanning method, the present invention can also be used with an internal-drum scanning method.

Moreover, although this embodiment uses two laser-beam scanning heads 8$a$1, 8$a$2 and 8$b$1 and 8$b$2, as is mentioned above, it is also possible to use only one laser-beam scanning head 8 or three or more laser-beam scanning heads 8.

Furthermore, an image drawing signal (digital signal) is sent to the laser-beam scanning head 8 of the exposure section B from a computer for making the printing plate at the exposure section by means of a drawing controller (not illustrated), and laser-beam scanning corresponding to the image drawing signal is applied to surfaces of the OPC plates P; thus, image signal pictures are drawn as electrostatic latent images on the OPC plates P. That is, when a laser beam is applied, carriers are produced in the OPC layer, positive electric charges are removed from the OPC-layer by the produced carriers and thus, an electrostatic latent image corresponding to the drawing is formed.

An electrification treatment, that is, supplying positive electric charges to the OPC-layer surface of the plate P by corona discharge, is applied at the exposure section B before this laser-beam scanning takes place. However, because this treatment is the same as in the prior art, its description is omitted.

The plate discharge section C comprises the discharge table 9 provided prior to the development section D. The discharge table 9 has at least one conveyor-system pin 13 for temporarily holding each of the exposed plates P and delivering each of the plates P, as held, to the development section D, one by one.

In the development section D, toner particles, positively charge, are attached, in a so-called reversal development method, to each of the respective electrostatic latent images on the plate surfaces formed at the exposure section B, and the respective electrostatic latent images are thusly developed. Moreover, the developed toner particles are thereafter heated by a halogen lamp, or the like, to thereby become fixed. Furthermore, the developed and fixed plate P is then sent to an elution section where a plate surface for printing is formed by removing the OPC layer, other than the fixed toner image portion, with an alkaline solution; and finally, the plate surface is subjected to a protective treatment in which mucilage is applied to the surface.

In the case of this embodiment, a plate P is first transferred onto the first table 10$a$ by the transfer unit 3 via a route $R_1$ and then it is shoved toward the first exposure barrel 6$a$ by the extrusion pin 12 to be wound around the first exposure barrel 6$a$ by rotation of the roller 7$a$ and the first exposure barrel 6$a$ in the direction of the arrow.

Moreover, the plate P after being exposed by the laser-beam scanning head 8$a$, is unwound and delivered from the first exposure barrel 6$a$ to the second table 11$a$ by rotating the roller 7$a$ and the first exposure barrel 6$a$ in the arrow direction. The plate P is then transferred onto the discharge table 9 by the transfer unit 3 via a route $R_2$ and then it is delivered to the development section D by the extrusion pin 13.

The same operations are also performed at the second exposure barrel 6$b$, with a plate P transferred onto the first table 10$b$ via a route $R_4$ being transferred onto the discharge table 9 via a route $R_5$, where it is then delivered to the development section D.

As described above, in the case of this embodiment, the first table 10$a$, 10$b$ and the second table 11$a$, 11$b$ are separately respectively provided forwardly (upstream) and rearwardly (downstream) of the exposure barrels 6$a$ and 6$b$. Therefore, for example, transfer of an exposed plate P onto the second table 11$a$, transfer of a new plate P onto the first table 10$b$, and transfer of a new plate P onto the first table 10$a$ can be performed during the time (approx. 153 sec) of an exposure rotation of the exposure barrel 6$a$ and thus, the so-called waiting time can be reduced to approximately 0.

As a result, though the length of the machine body K is increased by dimensions of the second tables 11$a$ and 11$b$, it is possible to greatly increase the speed of making printing plates compared to that of the double-barrel machine shown in FIGS. 9 to 11.

Figure 3:
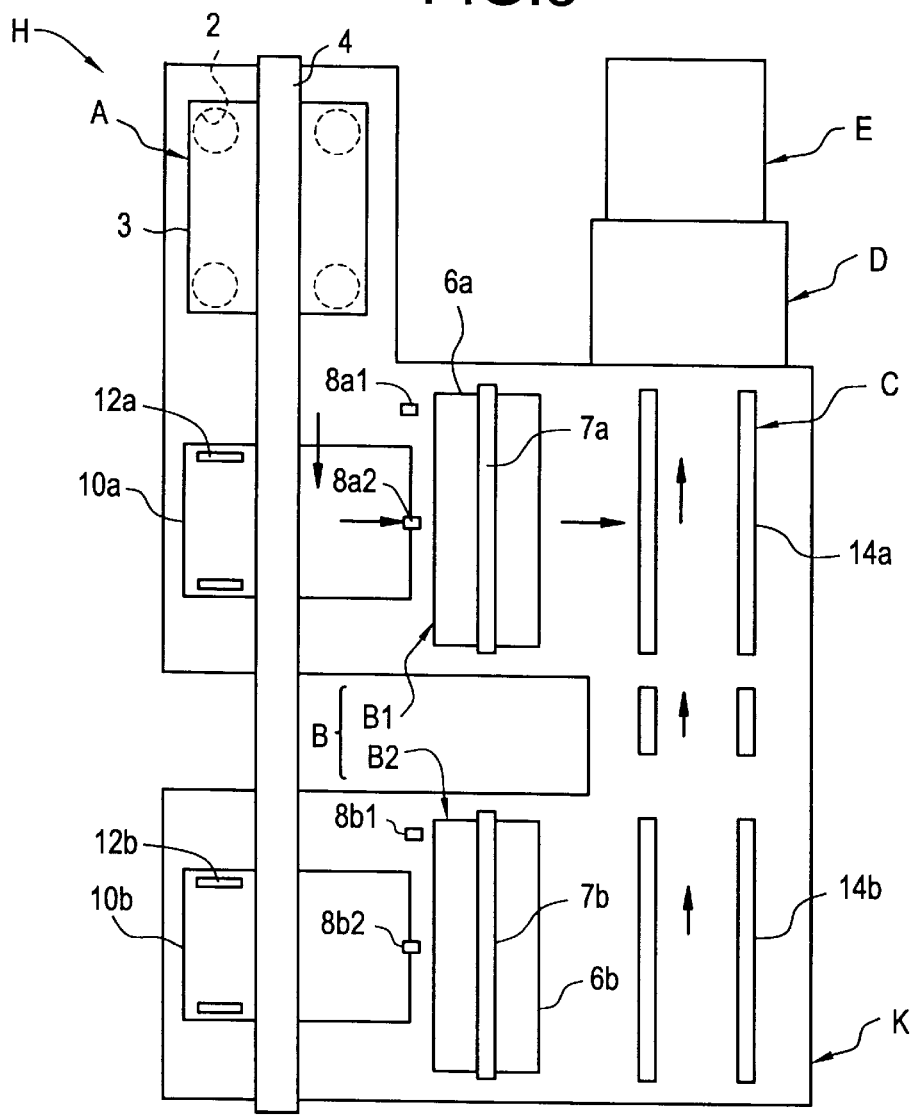
FIG. 3 is a schematic top view of a news-printing photoengraving machine of a second embodiment of the present invention.
Figure 4:
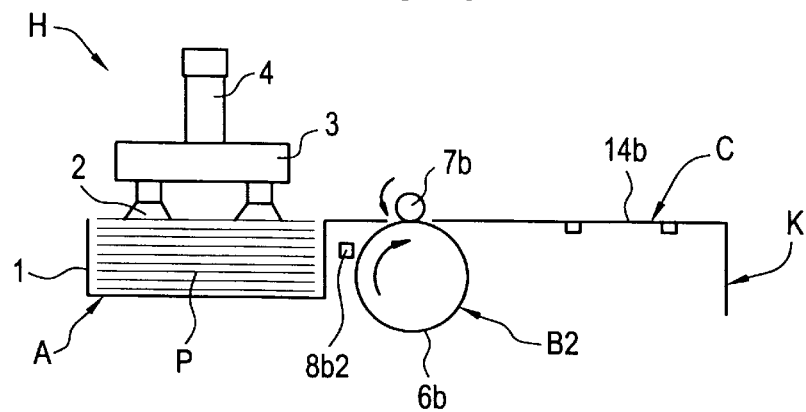
FIG. 4 is a schematic side view of the machine in FIG. 3.

FIGS. 3 and 4 are respectively schematic top and side views showing the second embodiment of the present invention. In FIGS. 3 and 4, symbol A denotes a plate feed section, B donates an exposure section, C denotes a plate discharge section, D denotes a development section, and E denotes a plate storage section. In the case of the second embodiment, two sub-exposure sections B1, B2 have exposure barrels which are rotatable about longitudinal axes oriented in a longitudinal direction of a machine body K and respectively arranged at intervals along the longitudinal direction. Routes for transferring a new form plate P from the plate feed section A to each sub-exposure section B1, B2 and routes for transferring exposed plates P from each sub-exposure section B1, B2 to the development section D are separately formed at different sides of the sub-exposure sections B1, B2.

In the case of this embodiment, a time period from when the transfer unit 3 has transferred a plate P from the stocker case 1 to one sub-exposure section B1 up to a time when the unit 3 has transferred a next plate P to the other sub-exposure section B2 is approximately 45 sec (15 sec×3). Therefore, if a time of exposure by rotation of an exposure barrel is shorter than approx. 50 sec, it is possible to continuously perform "plate making" without requiring a plate waiting time.

That is, by using three laser-beam scanning heads 8 and forming drawings on plates equivalent to one page of newspaper in approx. 50 sec, it is possible to perform the "printing plate making" without requiring a plate waiting time and obtain a very high operation efficiency.

Because the speed of treatment of plates P is fast, it is preferable to construct a conveyer system 14$a$ to be vertically movable and to appropriately determine a timing for delivering exposed plates P from the first exposure barrel 6$a$ and the second exposure barrel 6$b$ to the development section D.

As described above, the second embodiment makes it possible to achieve a printing-plate-making speed approximately three times higher than that of the prior-art double-barrel system shown in FIGS. 9 and 11.

Figure 5:
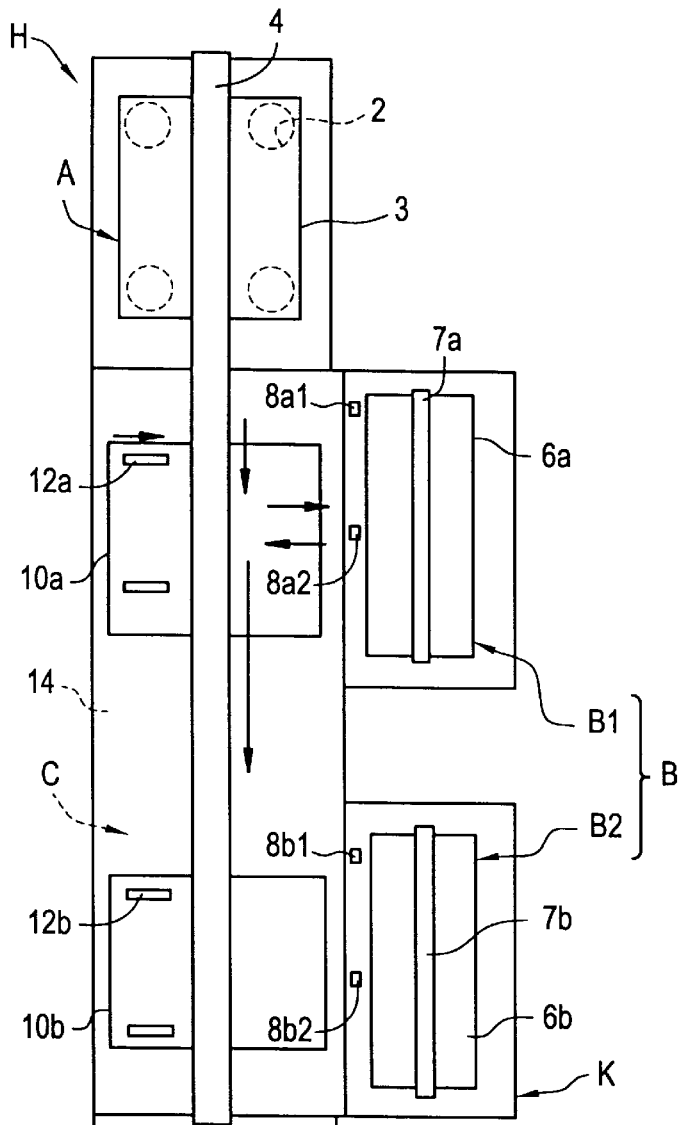
FIG. 5 is a schematic top view of a news-printing photoengraving machine of a third embodiment of the present invention.
Figure 6:
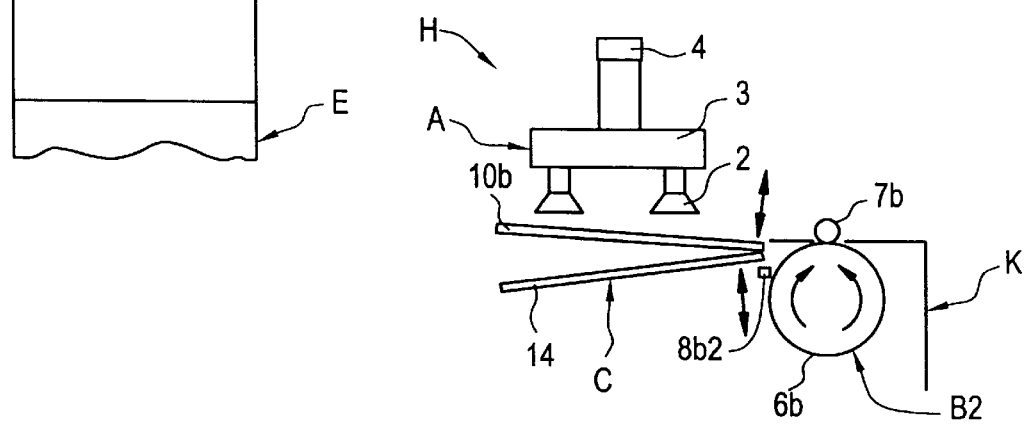
FIG. 6 is a schematic side view of the machine in FIG. 5.

FIGS. 5 and 6 are respectively schematic top and side views showing the third embodiment of the present invention.

This embodiment is arranged so that a route for transferring plates P from a stocker case to an exposure section B by a transfer unit 3 and a route for transferring exposed form plates P from the exposure section B to a development section D are separated from each other, with the transfer routes being arranged at upper and lower levels, or stages.

That is, a transfer route (comprising a guide rail 4 and a transfer unit 3) is formed at a side of, but higher than, the two exposure barrels 6a and 6b, which are rotatable about longitudinal axes extending in a longitudinal direction of a machine body K and which are arranged at intervals along the longitudinal direction, while a transfer route comprising a conveyer system 14 is formed thereunder in a superposed state.

The third embodiment also makes it possible to continuously make printing plates without waiting time for a plate if a time for a rotation exposure of an exposure barrel 6 is shorter than approx. 50 sec., similarly to the second embodiment.

Moreover, in the case of the third embodiment, a space occupied by the machine can be decreased, and therefore, it is possible to set the machine in a narrow place.

Figure 7:
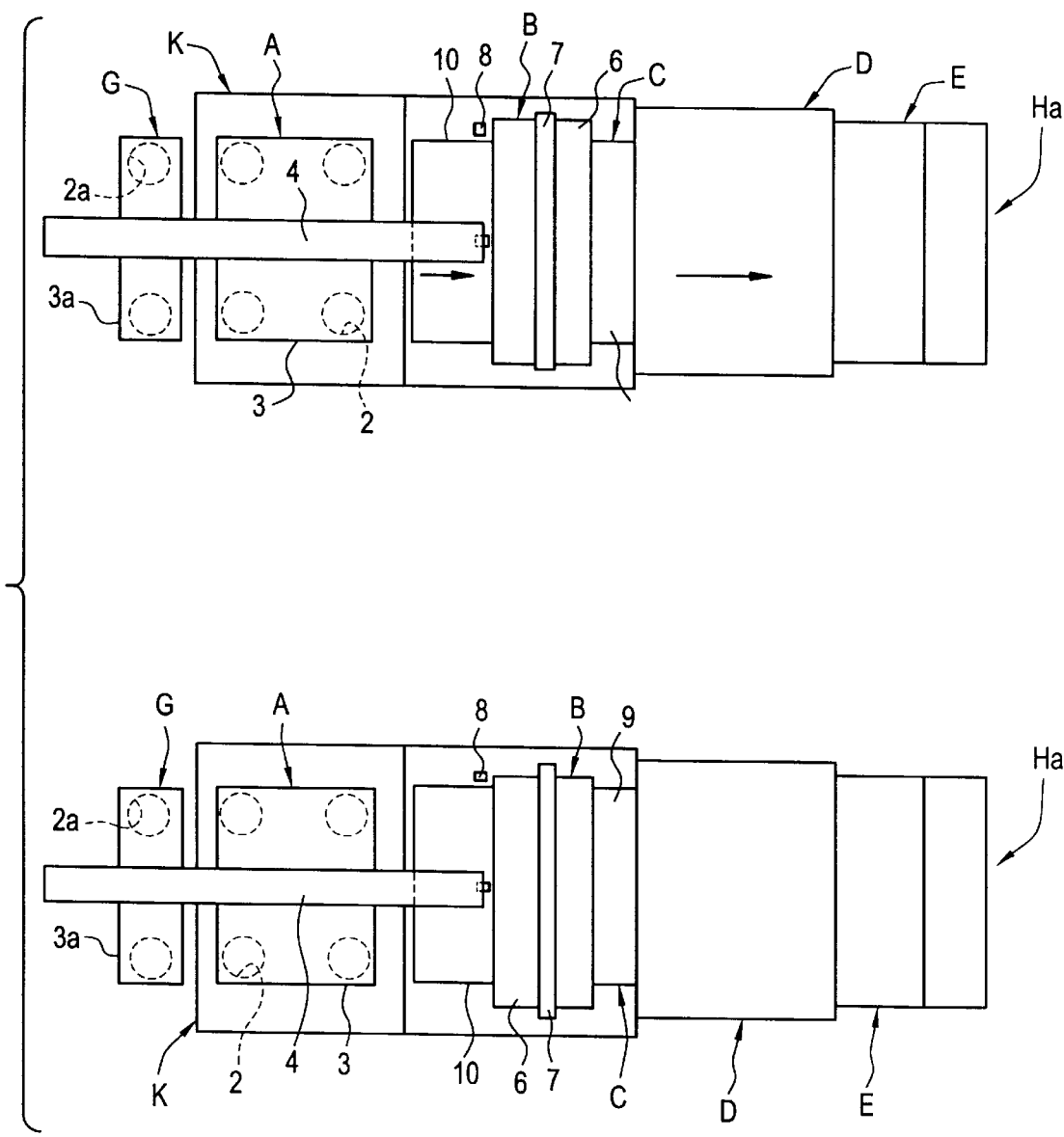
FIG. 7 is a schematic top view of a news-printing photoengraving machine of a fourth embodiment of the present invention.
Figure 8:
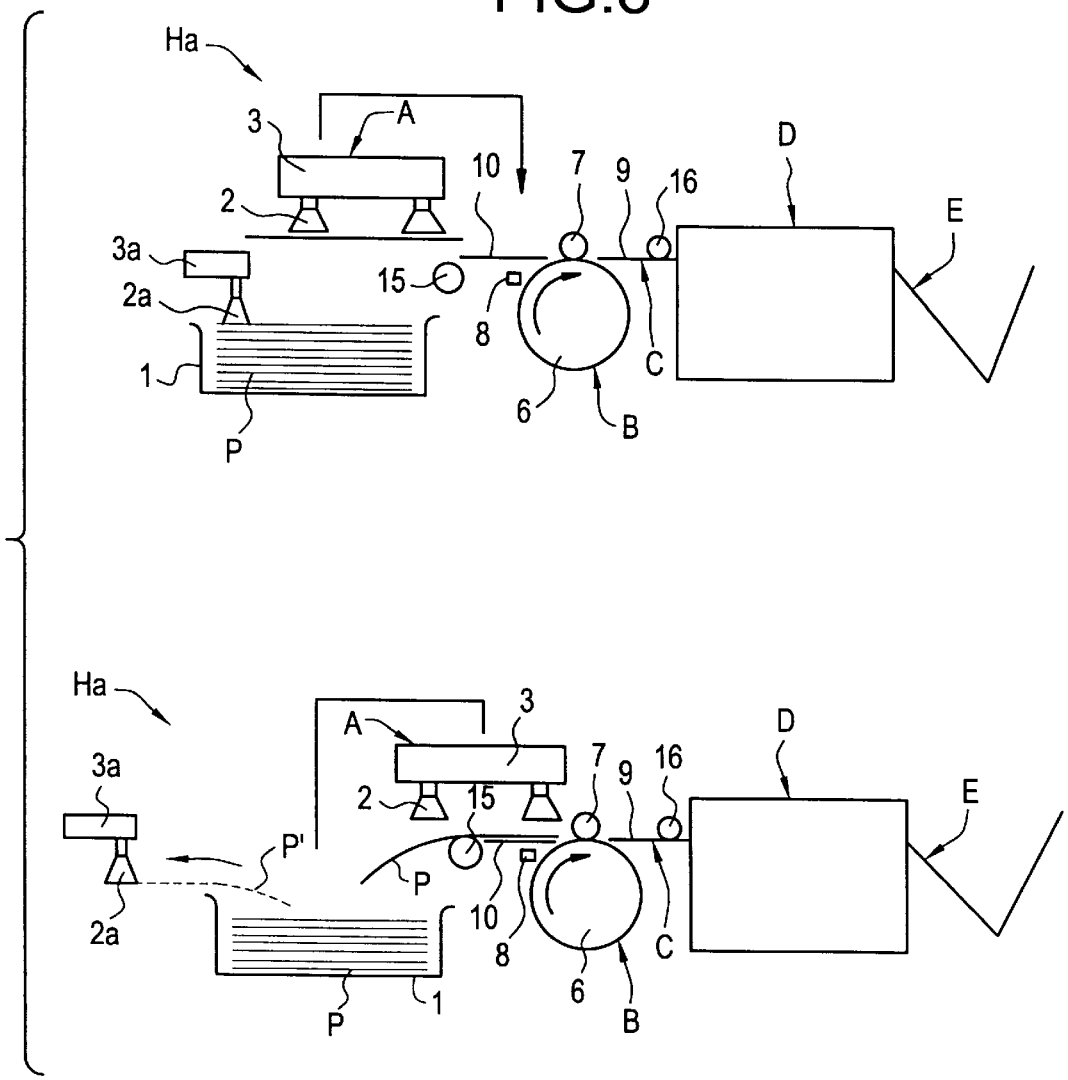
FIG. 8 is a side view of the machine in FIG. 7.

FIGS. 7 and 8 are respectively a schematic top view and a schematic side view showing a fourth embodiment of the present invention.

In FIGS. 7 and 8, symbol A denotes a plate feed section, B denotes an exposure section, C denotes plate discharge section, D denotes a development section, and E denotes a plate storage section. In the case of the fourth embodiment, two single-barrel machines Ha are simultaneously used to decrease a longitudinal dimension of a machine body K.

The form-plate feed section A comprises a stocker case 1 for storing a plurality of plates P and a transfer unit 3 provided above the case so as to be movable up and down to transfer plates P held by suckers 2 in the longitudinal direction of the machine body K along a guide rail 4.

The exposure section B comprises an exposure barrel 6 on which plates P are wound, a laser-beam scanning head 8 for forming a drawing on the plates P wound on the barrel 6, and a first table 10 provided on a side of the exposure barrel 6 toward the plate feed section A to hold the plates P and push them to the exposure barrel 6. The first table 10 temporarily holds the plates P and has an extrusion roller 15 for pushing the held plates P to the exposure barrel 6.

The plate discharge section C comprises a discharge table 9 at an exposure-section-B side of the development section D to hold and carry the exposed plates P to the development section D. The discharge table 9 is provided with an extrusion roller 16 for pushing exposed plates P to the development section D.

Symbol G denotes a slip-sheet disposal section for holding slip sheets P' for protecting the surfaces of plates P with a slip sucker 2a and ejecting them with a slip-sheet transfer unit 3a.

The fourth embodiment has advantages that two independent single barrel machines H provide, with each machine being independently operated at a high efficiency; and moreover, the maintainability and the light-interrupting characteristics of the machine are greatly improved, completely offsetting increased manufacturing costs of the machine.

Effect of the Invention

In the case of the invention of the first embodiment, it is possible to greatly decrease the amount time necessary for waiting for plates, although the machine body length is slightly increased because the second tables for holding exposed plates P are provided at the exposure sections B1 and B2.

Moreover, in the case of the invention of the second embodiment, it is possible to continuously make printing plates without requiring time waiting for plates, if a required exposure time is approx. 50 sec or more (which, effectively shows the advantage obtained by increasing the number of laser-beam scanning heads 8), because a route for feeding new plates P from the plate feed section A to the exposure section B is laterally offset from a route for delivering exposed plates P from the exposure section B to a development section D.

Furthermore, in the case of the third embodiment of the invention, it is possible to decrease a floor space for installing the machine and to set the machine in a narrow place because separated routes for feeding new plates P and ejecting exposed plates P are positioned at upper and lower levels.

Furthermore, in the case of the fourth embodiment of the invention, it is possible to independently operate each machine at a high efficiency because at least two single-barrel machines Ha are used. Moreover, advantages of ease in maintainability and light-interrupting characteristics of the machine are greatly improved so that increased manufacturing costs of the machine are completely offset.

DESCRIPTION OF SYMBOLS

1 . . . Stocker case, 2 . . . Sucker, 2a . . . Slip sucker, 3 . . . Transfer unit, 3a . . . Slip-sheet transfer unit, 4 . . . Guide rail, 5 . . . Table, 6 . . . Exposure barrel, 7 . . . Enfolding roller, 8 . . . Laser-beam scanning head, 9 . . . Table, 10 . . . First table, 11 . . . Second table, 12 and 13 . . . Extrusion pin, 14 . . . Conveyer system, 15 and 16 . . . Extrusion roller, A . . . Form-plate feed section, B . . . Exposure section, C . . . Form-plate ejection section, D . . . Development section, E . . . Machine-plate storage section, F . . . Dark-room section, G . . . Slip-sheet disposal section, H and Ha . . . News-printing engraving machine, K . . . Machine body, P . . . Form plate, P' . . . Slip sheet, $R_1$ to $R_5$ . . . Route

The invention claimed is:

1. A machine for making printing plates having a plate feed section (A), an exposure section (B), a plate discharge section (C), and a development section (D) serially arranged along a machine body (K) to form a drawing corresponding to a drawing image signal output from a computer on surfaces of plates (P); wherein:

said plate feed section (A) comprises a stocker case (1) for storing a plurality of form plates (P) and a transfer unit (3) positioned above said stocker case (1) comprising a sucker (2) which is movable up and down and a guide rail (4) for guiding said sucker to transfer said plates (P) held by said sucker (2) along said guide rail (4) in a longitudinal direction of the machine body (K);

said exposure section (B) comprises: at least two rotatable exposure barrels (6a, 6b) on which said form plates (P) are wound, said exposure barrels being arranged at intervals in the longitudinal direction of the machine body (K), laterally adjacent the plate feed section (A), and being oriented with their rotation axes in the longitudinal direction; a laser-beam scanning head (8) for forming drawings on said form plates (P) wound on said exposure barrels (6a, 6b); and first tables (10a, 10b) respectively provided on sides toward the plate feed section (A) of said exposure barrels (6a, 6b) to hold said plates (P) and push them to said exposure barrels (6a, 6b); and said plate discharge section (C) comprises a conveyor system (14) laterally adjacent the exposure section (B), but on a side thereof remote from the plate feed section (A), to transfer exposed plates (P) sent from said exposure barrels (6*a*) and (6*b*) in the longitudinal direction of the machine body (K);

wherein plates (P) are transferred from said stocker case (1) to said first tables (10*a*, 10*b*) by said transfer unit (3) and exposed plates (P) are transferred from said exposure barrels (6*a*, 6*b*) to said development section (D) by said conveyor system (14).

2. A machine for making printing plates having a plate feed section (A), an exposure section (B), a plate discharge section (C), and a development section (D) serially arranged along a machine body (K) to form a drawing corresponding to a drawing image signal output from a computer on surfaces of plates (P); wherein:

said form plate feed section (A) comprises a stocker case (1) for storing a plurality of form plates (P) and a transfer unit (3) positioned above said stocker case (1) comprising a sucker (2) and a guide rail (4) for guiding the sucker to transfer said plates (P) held by said sucker (2) along said guide rail (4) in a longitudinal direction of the machine body (K);

said exposure section (B) comprises at least two rotatable exposure barrels (6*a*, 6*b*) on which said form plates (P) are wound arranged at intervals in the longitudinal direction of the machine body (K) adjacent the plate feed section (A) and being oriented with their rotation axes in the longitudinal direction; a laser-beam scanning head (8) for forming drawings on said plates (P) wound on said exposure barrels (6*a*, 6*b*); and first tables (10, 10*b*) respectively provided on sides of said exposure barrels (6*a*, 6*b*), toward the plate feed section (A), to hold said plates (P) and push them to said exposure barrels (6*a*, 6*b*); and said plate discharge section (C) comprises a conveyor system (14) at a different vertical level than said plate feed section (A) to transfer exposed plates (P) sent from said exposure barrels (6*a*, 6*b*) in the longitudinal direction of said machine body (K);

wherein said plates (P) are transferred from said stocker case (1) to said first tables (10*a*, 10*b*) by said transfer unit (3) and said exposed plates (P) are transferred from said exposure barrels (6*a*, 6*b*) to said development section (D) by said conveyor system (14).

* * * * *